United States Patent
Kobayashi

(10) Patent No.: US 7,307,559 B2
(45) Date of Patent: Dec. 11, 2007

(54) SERIAL-TO-PARALLEL CONVERTER CIRCUIT AND PARALLEL-TO-SERIAL CONVERTER CIRCUIT

(75) Inventor: Hideaki Kobayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/359,368

(22) Filed: Feb. 23, 2006

(65) Prior Publication Data

US 2006/0192701 A1      Aug. 31, 2006

(30) Foreign Application Priority Data

Feb. 28, 2005     (JP)     ............................. 2005-053169

(51) Int. Cl.
*H03M 9/00*     (2006.01)
(52) U.S. Cl. ........................ 341/101; 341/50
(58) Field of Classification Search ......... 341/100–101
See application file for complete search history.

(56) References Cited

U.S. PATENT DOCUMENTS 5,089,819 A * 2/1992 Yokosuka et al. .......... 341/101
5,155,487 A * 10/1992 Tanaka et al. .............. 341/100
6,335,696 B1 * 1/2002 Aoyagi et al. .............. 341/100

FOREIGN PATENT DOCUMENTS

JP     2002-135132 A     5/2002

* cited by examiner

*Primary Examiner*—Lam T. Mai
(74) *Attorney, Agent, or Firm*—Sughrue Mion, Pllc.

(57) ABSTRACT

A parallel-to-serial converter selects variable-m1-bit parallel dummy data from m-bit parallel dummy data ($0 \leq m1 \leq m$) together with a n-bit parallel data signal synchronized with a first clock signal having a first frequency, and converts the selected (n+m1)-bit parallel data into a (n+m1)-bit serial data signal synchronized with a second clock signal having a frequency (n+m1) times the first frequency. A serial-to-parallel converter circuit selects n-bit serial data from the (n+m1) parallel data signal and converts the n-bit serial data into a n-bit parallel data signal synchronized with the first clock signal.

5 Claims, 6 Drawing Sheets

SERIAL-TO-PARALLEL CONVERTER CIRCUIT AND PARALLEL-TO-SERIAL CONVERTER CIRCUIT

BACKGROUND OF THE INVENTION

1. Field of the Invention

The present invention relates to a serial-to-parallel converter circuit and a parallel-to-serial converter circuit, and more specifically to a serial-to-parallel converter circuit and a serial-to-parallel converter circuit which use a signal transmission technique using dummy data (redundant data) in a data signal to be transmitted/received.

2. Description of the Related Art

There has been a known SerDes transmission scheme to perform high-speed signal transmission with use of a parallel-to-serial converter circuit and a serial-to-parallel converter circuit. With the recent rise of frequency in SerDes transmission, a PLL for generating a clock signal for serial data transmission has been requested to generate a high-frequency clock signal and have an extremely small jitter performance. To satisfy these requests for performance, necessity has been enhancing for use of a PLL having a broad frequency range and a narrow frequency setting width.

In the internal of a recent LSIs, the clock frequency is temporarily lowered, for example, to reduce the power consumption of the LSIs. Thus, a PLL is indispensable which allows the frequency setting independently from the frequency of the SerDes transmission. However, according to the conventional SerDes transmission scheme, the bit number or bit width of parallel data and the frequency conversion ratio between the parallel data and serial data are constant. Therefore, the serial transmission frequency and the internal frequency of the LSI cannot be set independently from each other.

Patent Publication JP-2002-135132A describes a serial-to-parallel converter circuit having a judgement section. The judgement section once buffers serial data, which are input in synchronously with a first clock signal and includes dummy data. The judgement section judges whether the data stored in the buffer are valid or invalid in a unit-by-unit basis, each unit including a plurality of bits. In this serial-to-parallel converter circuit, only those data cells that have been judged as being valid are output in synchrony with a second clock signal slower than the first clock signal. In this manner, the serial data signal transmitted based on the first clock signal can be received as parallel data based on the second clock signal having a lower frequency.

DISCLOSURE OF THE INVENTION

Problems to be Solved by the Invention

According to the technique described in the above patent publication, serial data signal generated based on the first clock signal can be received as parallel data in synchrony with the second clock signal slower than the first clock signal. In this manner, the serial-to-parallel converter circuit is allowed to have a frequency conversion function. However, since whether the serial data are valid or invalid are determined in this technique in a unit-by-unit basis wherein each unit includes a plurality of bits, a problem arises in that the step width of the frequency for conversion into parallel data is restricted.

If the step width of the convertible frequency is larger, the step width of the frequency of an internal logic circuit operating in synchrony with the parallel data is restricted by the frequency step width of the PLL circuit used for the serial data. This will cause a larger restriction when used as a measure for reducing the power consumption of an LSI by dynamically reducing the operating frequency and when used in a system test for a SerDes transmission scheme based on a prerequisite of variable frequency.

In view of the above situation, it is an object of the present invention to provide a serial-to-parallel converter circuit and a parallel-to-serial converter circuit which are preferably used according to the SerDes transmission scheme and suitable for an LSI which operates at a high speed, wherein a variable step width of operating frequency can be set narrow, so that power consumption of the LSI can be reduced by dynamically lowering the operating frequency, and system tests and the like are possible at an arbitrary lower frequency, when used for signal conversion in the transmission according to the SerDes transmission scheme.

Means for Solving the Problems

The present invention provides a parallel-to-serial converter circuit including: a select-signal generator circuit for generating a select signal specifying an integer (m1) which is set variably within a range of a predetermined number (m), where $0 \leq m1 \leq m$; a parallel-to-serial converter section for receiving parallel data including an n-bit parallel data signal and m-bit parallel dummy data in synchrony with a first clock signal having a first frequency, and selecting, based on the specified integer m1, m1-bit parallel dummy data from the m-bit parallel dummy data together with the n-bit parallel data signal, to convert the selected (n+m1)-bit parallel data into a (n+m1)-bit serial data signal; and a serial-data synchronization circuit for synchronizing the (n+m1)-bit serial data signal with a second clock signal having a second frequency which is (n+m1) times the first frequency.

The present invention also provides a parallel-to-serial converter circuit for receiving the serial data signal from the serial-to-parallel converter circuit of the present invention, the parallel-to-serial converter circuit including: a select circuit for selecting n-bit parallel data corresponding to the n-bit parallel data signal from the (n+m1)-bit parallel data signal received from the serial-to-parallel converter circuit; and a synchronization circuit for synchronizing the selected n-bit parallel data with a third clock signal having a third frequency to generate an output n-bit parallel data signal.

The parallel-to-serial converter circuit according to the present invention has a configuration in which m1-bit parallel dummy data are selected from m-bit parallel dummy data of a fixed length and are converted, together with an n-bit parallel data signal, into a serial data signal. This configuration enables fine setting of a frequency ratio when performing parallel-to-serial conversion. Therefore, if the parallel-to-serial converter circuit is used in a signal transmission system which adopts the SerDes signal transmission scheme, the internal logic frequency of the LSI can be finely set independently from the frequency of the serial transmission, by properly selecting m1. As a result, reduction of power consumption by lowering the internal frequency of the LSI is facilitated, and restrictions to a frequency used for a transmission test in serial transmission, for example, can be suppressed.

Preferably, in the present invention, the third clock signal is same as the first clock signal, or the third frequency is equal to the first frequency.

DETAILED DESCRIPTION OF THE PREFERRED EMBODIMENT

Figure 1:
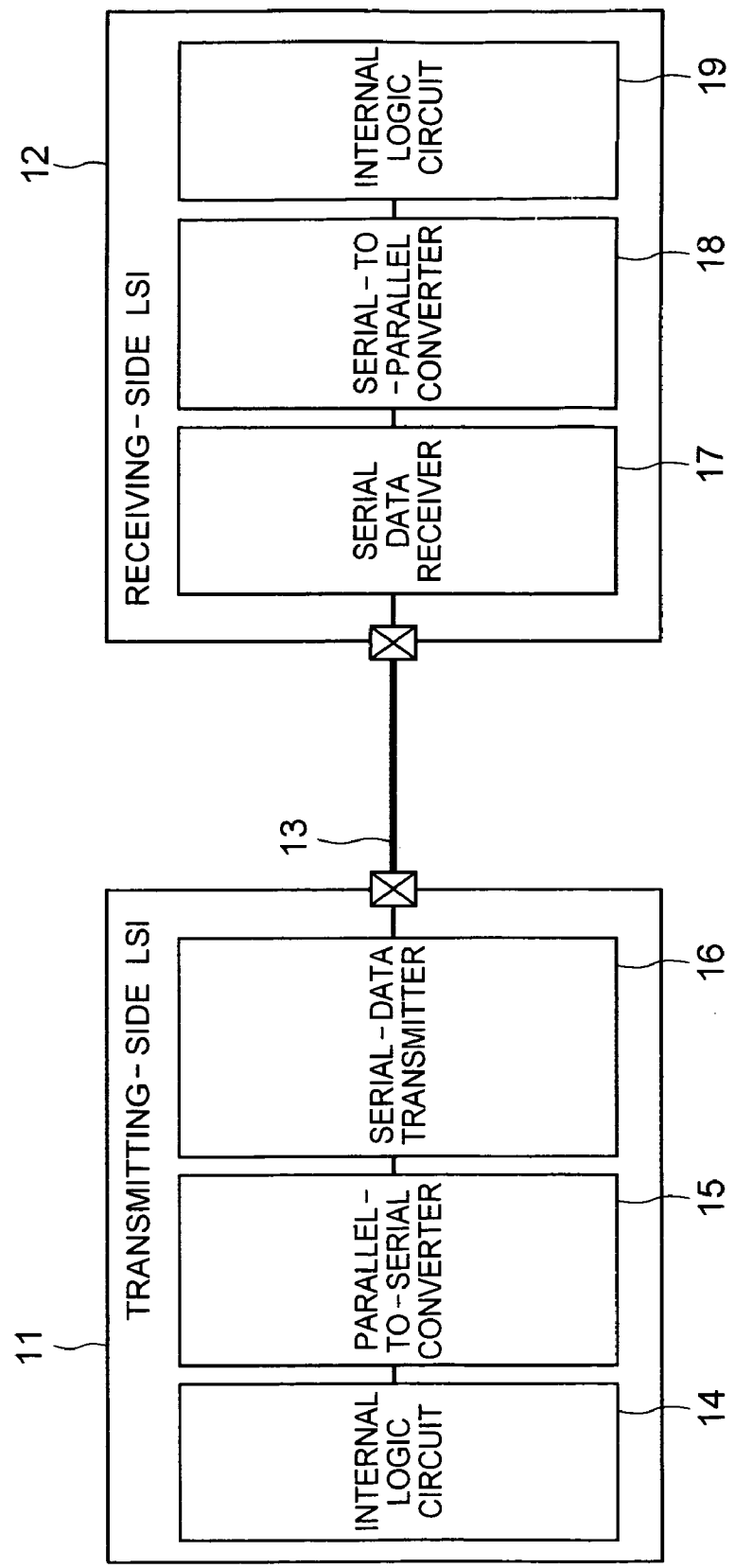
FIG. 1 is a block diagram of a signal transmission system, which performs SerDes signal transmission, according to an embodiment of the present invention.

FIG. 1 is a block diagram of a transmitter/receiver system including a serial-to-parallel converter circuit according to an embodiment of the present invention and a parallel-to-serial converter circuit according to an embodiment of the present invention. Both the LSIs 11 and 12 are generally included in a single transmitter/receiver circuit; however, FIG. 1 shows a transmitting-side LSI 11 and a receiving-side LSI 12, which are connected via a signal transmission line 13 for transmitting serial data from the transmitting-side LSI 11 to the receiving-side LSI 12.

The transmitting-side LSI 11 includes an internal logic circuit 14, a parallel-to-serial converter circuit 15, and a serial-data transmitter circuit 16, which are cascaded in this order in the transmitting-side LSI 11. The receiving-side LSI 12 has a serial-data receiver circuit 17, a serial-to-parallel converter circuit 18, and an internal logic circuit 19, which are cascaded in this order in the receiving-side LSI 12.

Figure 2:
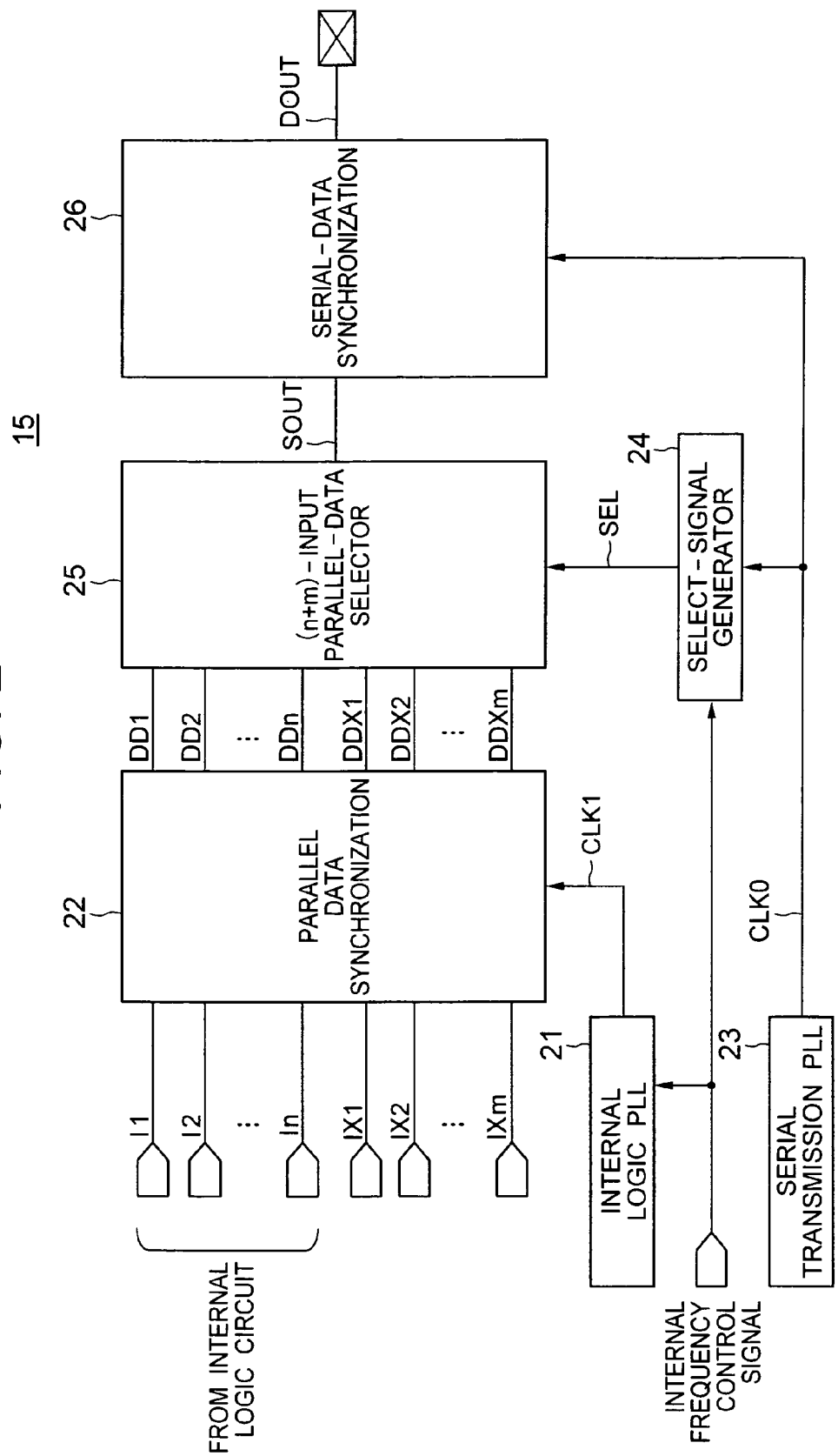
FIG. 2 is a block diagram of the parallel-to-serial converter circuit shown in FIG. 1.

Referring to FIG. 2, details of the parallel-to-serial converter circuit 15 shown in FIG. 1 will now be described. The parallel-to-serial converter circuit 15 is comprised of an internal logic PLL 21, a parallel-data synchronization circuit 22, a serial transmission PLL 23, a select-signal generator circuit 24, a (n+m)-input parallel-data selector 25, and a serial-data synchronization circuit 26. The internal logic PLL 21 generates an internal clock signal CLK1. The parallel-data synchronization circuit 22 synchronizes parallel data with the internal clock signal CLK1. The serial transmission PLL 23 generates a serial transmission clock signal CLK2.

The select-signal generator circuit 24 receives an internal frequency-control signal which specifies an arbitrary number, m1, which is equal to or smaller than m, and generates a select signal SEL specifying m1. In response to the select signal SEL, the (n+m)-input parallel-data selector 25 selects n-bit parallel data and parallel dummy data of a specified bit width, m1, and performs parallel-to-serial conversion. In the serially converted parallel data, the n-bit parallel data signal precedes the m1-bit parallel dummy data in this example. The serial-data synchronization circuit 26 synchronizes the serially converted (n+m1)-bit data with a signal transmission clock signal.

In FIG. 2, the reference symbols I1 to In denote transmission data (a parallel data signal) to be transmitted, which are generated by the internal logic circuit 14 in the transmitting-side LSI 11 and input to the parallel-data synchronization circuit 22. IX1 to IXm denote dummy data (parallel redundant data) to be added as higher-bit-order data to the parallel data signal. DD1 to DDn denote parallel data synchronized with the clock signal CLK1 generated by the internal logic PLL 21. DDX1 to DDXm denote parallel dummy data synchronized with the internal clock signal CLK1 together with DD1 to DDn.

SOUT denotes a serial data signal serialized in the (n+m)-input parallel-data selector 25 after selecting the m1-bit parallel dummy data DDX1 to DDXm1 from the m-bit parallel dummy data DDX1 to DDXm together with the n-bit parallel data DD1 to DDn. DOUT denotes a serial data signal obtained by synchronizing the serial data SOUT with the serial transmission clock CLK0 generated by the serial transmission PLL 23.

The output frequency of the internal logic PLL 21 is controlled by an internal frequency-control signal. The select-signal generator circuit 24 operates in conjunction with the internal frequency-control signal, to generate a select signal SEL for setting the input bit width of the (n+m)-input parallel-data selector 25 variably within a range between the n and the (n+m), i.e., $0 \leq m1 \leq m$. It should be noted that the m is a positive integer.

Figure 3:
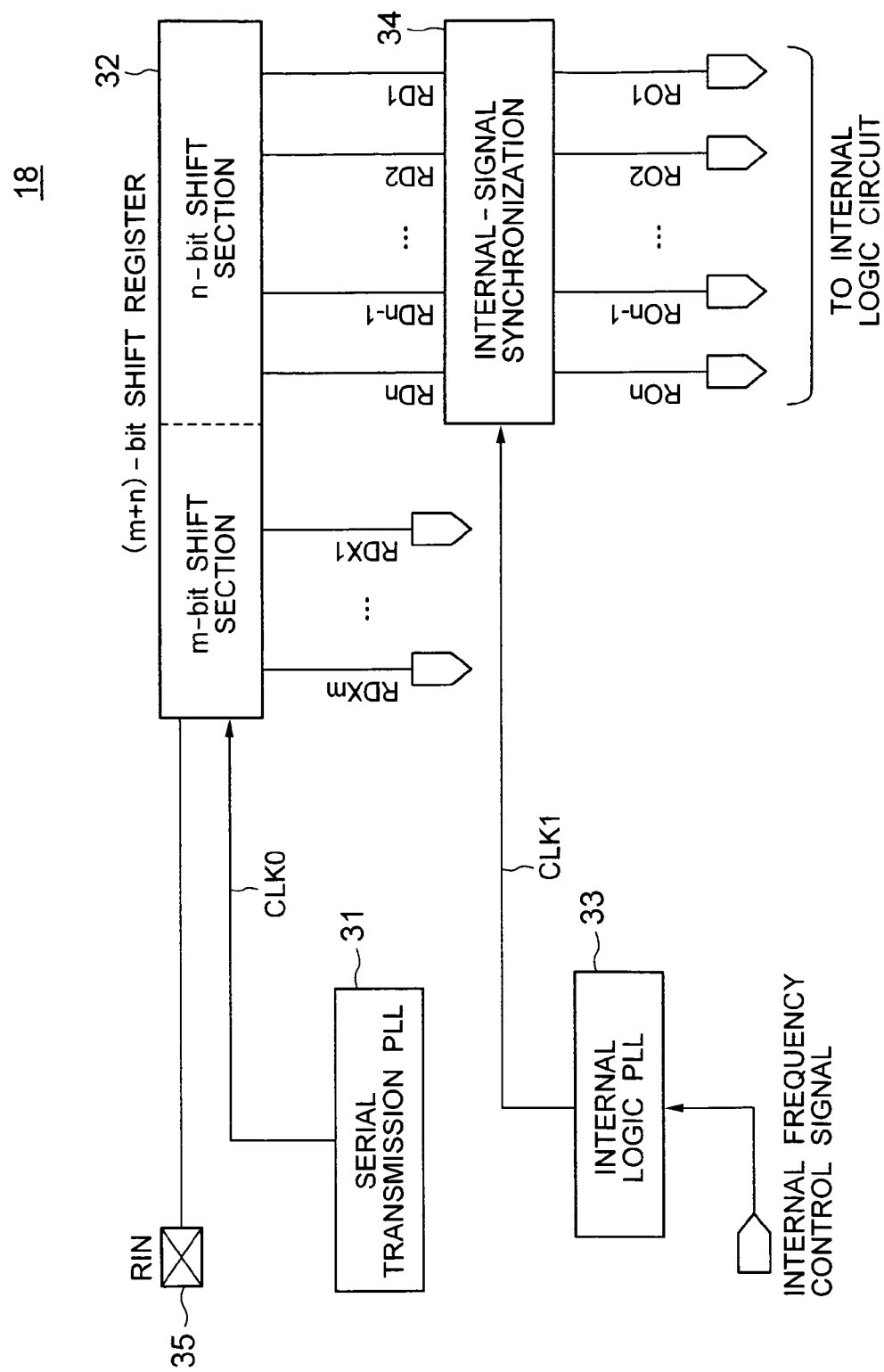
FIG. 3 is a block diagram of the serial-to-parallel converter circuit shown in FIG. 1.

Referring to FIG. 3, details of the serial-to-parallel converter circuit 18 shown in FIG. 1 will now be described. The serial-to-parallel converter circuit 18 is comprised of a serial transmission PLL 31, an (n+m)-bit shift register 32 which includes m-bit shift section and an n-bit shift section, an internal logic PLL 33, and an internal-signal synchronization circuit 34. The serial transmission PLL 31 generates the serial transmission clock signal CLK0.

RIN denotes a serial data signal transmitted from the transmitting-side LSI 11 through the signal transmission line 13. The (n+m)-bit shift register 32 receives serial data from the parallel-to-serial converter circuit 15 via an input pad 35. The internal logic PLL 33 generates the internal clock signal CLK1. The internal-signal synchronization circuit 34 receives the n-bit parallel data from the (n+m)-bit shift register 32, and synchronizes the same with the internal clock signal CLK1.

The (n+m)-bit shift register 32 is operated to shift the input serial data based on the serial transmission clock CLK0 generated by the serial transmission PLL 31. RD1 to RDn and RDX1 to RDXm denote the parallel data signal and the parallel dummy data, respectively, which have been converted into parallel data by use of the (n+m)-bit shift register 32. The internal-signal synchronization circuit 34 only receives first n-bit parallel data among the (n+m1)-bit parallel data, i.e., the n-bit data signal RD1 to RDn, from the n-bit shift section of the (n+m)-bit shift register 32. Thus, the m1-bit dummy data output from the m-bit shift section of the (n+m) shift register 32 are discarded.

RO1 to ROn denote the parallel data signal output from the internal-signal synchronization circuit 34, which synchronizes the parallel data signal RD1 to RDn with the internal clock signal CLK1 generated by the internal logic PLL 33. The parallel data signal RO1 to ROn is input to the internal logic circuit 19 of the receiving-side LSI 12, which operates in synchrony with the internal clock signal CLK1.

The configuration of the embodiment has been described above in detail. The serial-data transmitter circuit 16, the serial-data receiver circuit 17, internal logic PLLs 21 and 33, serial transmission PLLs 23 and 31, and selector generator circuit 24 used in the above embodiment are well known to skilled persons in the art. Thus, the detailed configuration of these components will be omitted herein for description.

Figure 4:
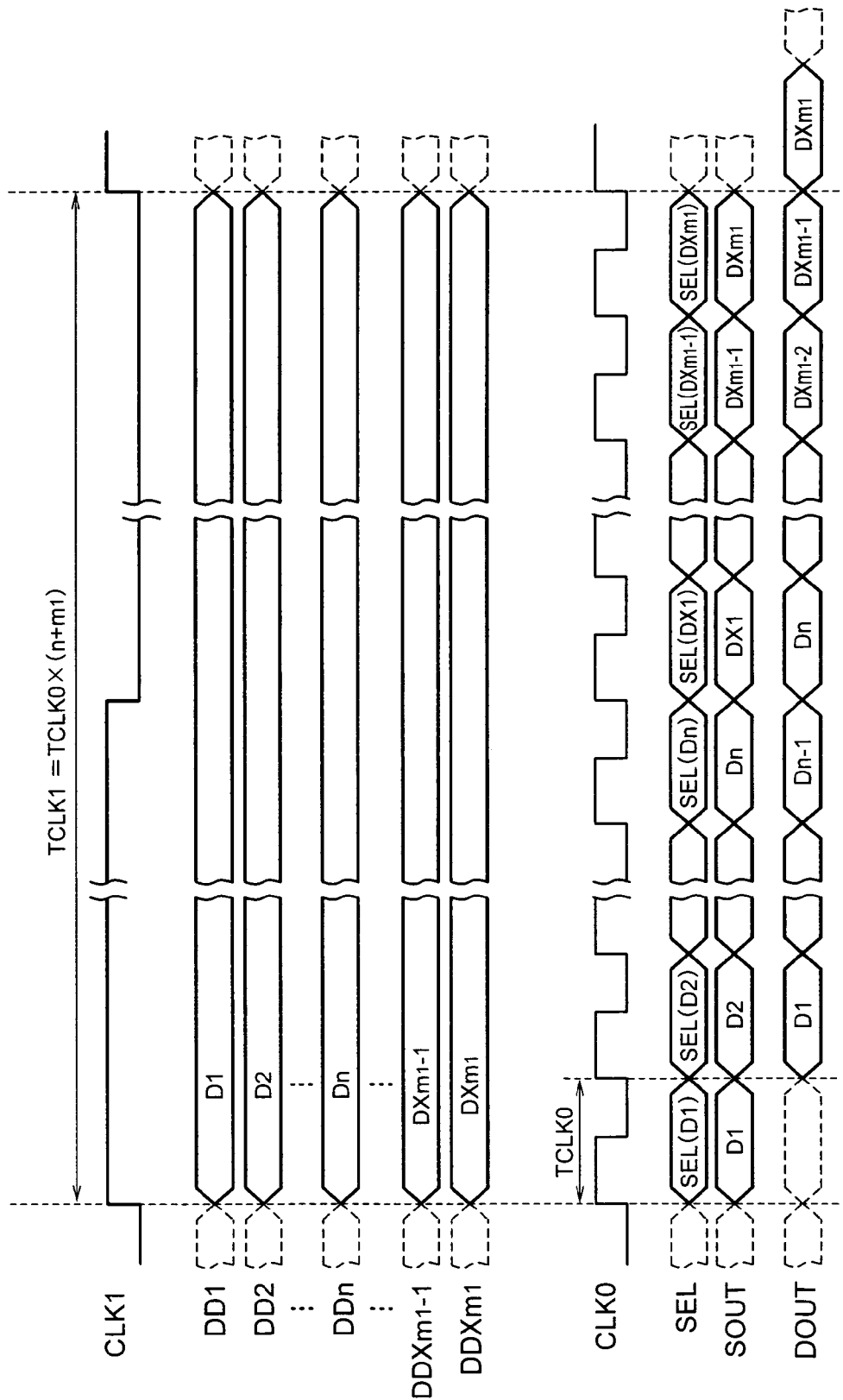
FIG. 4 is a time chart of signals in the parallel-to-serial converter circuit shown in FIG. 2.

Referring next to the time chart shown in FIG. 4, operation of the parallel-to-serial converter circuit 15 shown in FIG. 2 will now be described. FIG. 4 shows the parallel data signal DD1 to DDn and parallel dummy data DDX1 to DDXm, a select signal SEL, clock signals CLK1 and CLK0 and output data SOUT and DOUT. The parallel data signal DD1 to DDn and parallel dummy data DDX1 to DDXm are combined together and synchronized with the internal clock signal CLK1 by the parallel-data synchronization circuit 22, the internal clock signal CLK1 being generated by the internal logic PLL 21.

The select signal SEL is input as a control signal for the (n+m)-input parallel-data selector 25 which converts those parallel data into serial data DOUT. The select signal SEL is a counter output signal, which has a maximum countable number controlled to (n+m) bits and is counted in synchrony with the serial transmission clock CLK0. Based on the select signal SEL specifying the number m1, the parallel data signal DD1 to DDn and parallel dummy data DDX1 to DDXm1 are selected, combined and output as the selector output signal SOUT. The selector output signal SOUT is synchronized with the serial transmission clock CLK0 in the serial-data synchronization circuit 26, and output through the serial output terminal DOUT.

When the internal frequency-control signal is of a (n+m1)-bit width, the period TCLK1 of the internal clock signal CLK1 of the internal clock PLL circuit is expressed as TCLK1=(n+m1)×TCLK0 in terms of the period TCLK0 of the clock signal CLK0 of the serial transmission PLL circuit. The select signal SEL input to the (n+m)-input parallel-data selector 25 converts the (n+m1)-bit parallel data into serial data. In this conversion, m1 is a variable assuming from 0 to the maximum value, m. As a result, the period TCLK1 of the internal clock signal CLK1 of the internal clock PLL circuit is variable.

Figure 5:
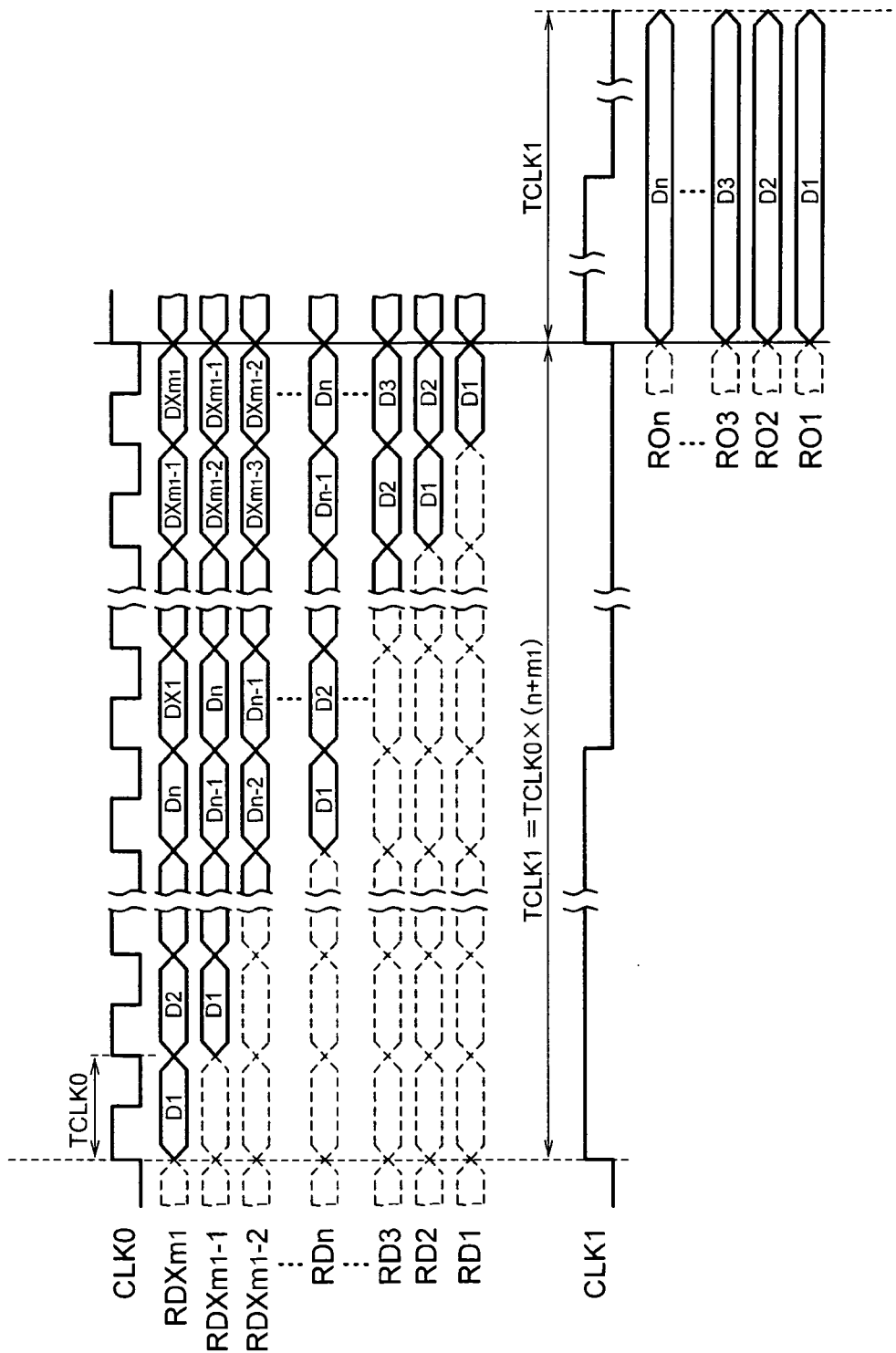
FIG. 5 is a time chart of signals of the serial-to-parallel converter circuit shown in FIG. 3.

Referring next to the time chart shown in FIG. 5, operation of the serial-to-parallel converter circuit 18 shown in FIG. 3 will now be described. FIG. 5 shows an output data signal of the (n+m)-bit shift register 32 and input and output data signals of the internal-signal synchronization circuit 34. The output signal of the (n+m)-bit shift register 32 is a signal after the serial signal RIN transmitted from the transmitting-side LSI 11 is shifted by (n+m1) bits based on the timing of the serial transmission clock CLK0. The internal-signal synchronization circuit 34 performs conversion of the input serial data into parallel data which is synchronized with the internal clock signal CLK1 generated by the internal logic PLL.

The serial signal RIN input from outside of the transmission/receiver circuit 10 is shifted by the (n+m)-bit shift register 32 based on the timing of the serial transmission clock CLK0, and is output as the output signals RD1 to RDn of the (n+m)-bit shift register 32 after (n+m1) clock cycles. The output signals RD1 to RDn of the (n+m)-bit shift register 32 are synchronized, by the (n+m)-bit shift register 32, with the internal clock signal CLK1 generated by the internal logic PLL 33, and are output as an output data signal RO1 to ROn to the internal logic circuit 19 shown in FIG. 1.

As has been described above, the parallel-to-serial converter circuit 15 and the serial-to-parallel converter circuit 18 are configured to have the redundancy, which provides variable-bit data up to the maximum of m bits for the n-bit parallel data signal to be transmitted. In this manner, the setting range of the internal frequency can be set variably from 1/n to 1/(n+m) with respect to the frequency of serial transmission. Accordingly, power consumption of the LSI can be reduced with ease by lowering the operating frequency, and system tests at a low-frequency range according to the SerDes transmission scheme are facilitated.

Figure 6:
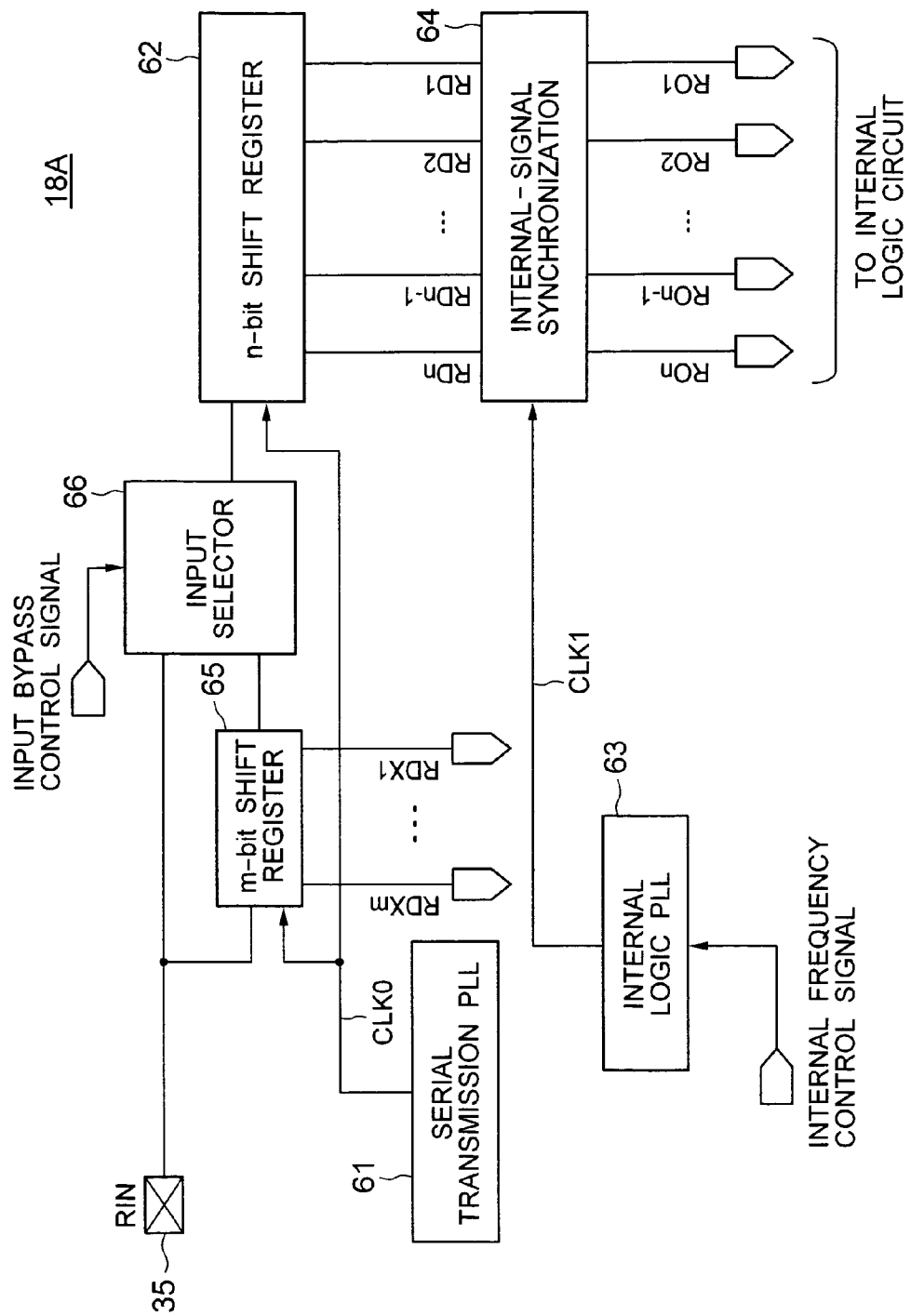
FIG. 6 is a block diagram showing a modification from the serial-to-parallel converter circuit shown in FIG. 3.

The basic configuration and operation of the embodiment of the present invention have been described above. However, a variety of variations can be made from the above embodiment. For example, the (n+m)-bit shift register 32 of the serial-to-parallel converter circuit 18 can be modified as follows. The configuration of a modification from the serial-to-parallel converter circuit 18 of the above embodiment is shown in FIG. 6.

In the serial-to-parallel converter circuit 18A of the modification, an input selector circuit 66 is inserted between a m-bit shift register 65 for dummy data shifting and an n-bit shift register 62 for data shifting. The dummy bit width, m, to be added has been known in advance. Therefore, the phase relationship between the internal clock signal CLK1 and the serial transmission clock CLK0 is defined uniquely. Using this feature, those m-bit dummy serial data are removed in advance by the input selector circuit 66 controlled by an input bypass control signal supplied from the internal logic circuit 19. Only n-bit regular serial data are input to the n-bit shift register 62. Since dummy data are not input to the n-bit shift register 62, increase in the data transmission latency can be suppressed in the case where the dummy data are not necessary.

The present invention has been described as above on the basis of the preferred embodiment thereof. The serial-to-parallel converter circuit and the parallel-to-serial converter circuit according to the present invention are not limited to the configuration described in the above embodiment. The scope of the present invention should be considered as including those configurations that would be derived by making various changes and modifications to the configuration of the above embodiment. Each of configurations described as the preferred embodiment of the invention and in the modification example thereof should preferably be used with the essential feature of the present invention. However, such a configuration that provides an advantage when used alone need not be used together with the total configuration described as the essential feature of the present invention.

The serial-to-parallel converter circuit and the parallel-to-serial converter circuit according to the present invention can be particularly preferably used as a signal converter circuit for the SerDes signal transmission scheme in an LSI.

What is claimed is:

1. A parallel-to-serial converter circuit comprising:
   a select-signal generator circuit for generating a select signal specifying an integer (m1) which is set variably within a range of a predetermined number (m), where $0 \leq m1 \leq m$;
   a parallel-to-serial converter section for receiving parallel data including an n-bit parallel data signal and in-bit parallel dummy data in synchrony with a first clock signal having a first frequency, and selecting, based on said specified integer m1, m1-bit parallel dummy data from said m-bit parallel dummy data together with said n-bit parallel data signal, to convert said selected (n+m1)-bit parallel data into a (n+m1)-bit serial data signal; and
   a serial-data synchronization circuit for synchronizing said (n+m1)-bit serial data signal with a second clock signal having a second frequency which is (n+m1) times said first frequency.

2. A parallel-to-serial converter circuit comprising:
   a select-signal generator circuit for generating a select signal specifying an integer (m1) which is set variably within a range of a predetermined number (m), where $0 \leq m1 \leq m$;

a parallel-to-serial convener section for receiving parallel data including an n-bit parallel data signal and m-bit parallel dummy data in synchrony with a first clock signal having a first frequency, and selecting, based on said specified integer m1, m1-bit parallel dummy data from said m-bit parallel dummy data together with said n-bit parallel data signal, to convert said selected (n+m1)-bit parallel data into a (n+m1)-bit serial data signal; and a serial-data synchronization circuit for synchronizing said (n+m1)-bit serial data signal with a second clock signal having a second frequency which is (n+m1) times said first frequency.

3. The parallel-to-serial converter circuit according to claim 2, wherein said select circuit includes a (n+m1)-bit shift register.

4. The circuit of claim 2, further comprising:
a serial-to-parallel converter circuit comprising:
a select circuit that includes:
a selector for selecting n-bit serial data from said (n+m)-bit serial data signal; and an n-bit shift register for shifting said n-bit serial data selected by said selector.

5. A parallel-to-serial converter circuit for receiving (n+m)-bit parallel data signals comprising:
a select circuit for selecting n-bit parallel data from said (n+m)-bit parallel data signal received; and
a synchronization circuit for synchronizing said selected n-bit parallel data with a clock signal having a frequency to generate an output n-bit parallel data signal.

* * * * *